United States Patent [19]
Hundt

[11] Patent Number: 6,028,773
[45] Date of Patent: Feb. 22, 2000

[54] PACKAGING FOR SILICON SENSORS

[75] Inventor: Michael J. Hundt, Denton, Tex.

[73] Assignee: STMicroelectronics, Inc., Carrollton, Tex.

[21] Appl. No.: 08/971,636

[22] Filed: Nov. 17, 1997

Related U.S. Application Data

[63] Continuation-in-part of application No. 08/970,511, Nov. 14, 1997.

[51] Int. Cl.[7] ........................................ H05K 7/02
[52] U.S. Cl. ........................ 361/760; 361/764; 361/765; 361/772; 361/820; 174/250; 174/259; 174/260; 257/684; 257/782; 257/783; 257/735; 257/784; 250/208.1
[58] Field of Search .................................. 361/760, 748, 361/764, 765, 772, 773, 820; 174/250, 259, 260, 52.1, 52.4; 257/684, 782, 783, 735, 690, 692, 694, 784, 778; 250/208.1

[56] References Cited

U.S. PATENT DOCUMENTS

| | | | |
|---|---|---|---|
| 3,641,431 | 2/1972 | Pigage et al. | 324/61 R |
| 4,814,691 | 3/1989 | Garbini et al. | 324/61 R |
| 4,891,687 | 1/1990 | Mallik et al. | 257/686 |
| 4,958,129 | 9/1990 | Poduje et al. | 324/661 |
| 4,999,484 | 3/1991 | Kaneko | 250/208.1 |
| 5,399,804 | 3/1995 | Yoneda et al. | 174/52.4 |
| 5,408,121 | 4/1995 | Nakamura et al. | 257/433 |
| 5,691,480 | 11/1997 | Cook, Sr. et al. | 73/756 |
| 5,757,073 | 5/1998 | Hoffmeyer | 257/700 |
| 5,874,047 | 2/1999 | Schoening et al. | 422/82.02 |

FOREIGN PATENT DOCUMENTS 0 226 082 A1   6/1987   European Pat. Off. .

OTHER PUBLICATIONS

Wolffenbuttel and Regtien, "Integrated Tactile Imager With An Intrinsic Contour Detection Option," *Sensors and Actuators*, 16, Jan./Feb. 1989.

Sarma and Barranger, "Capacitance–Type Blade–Tip Clearance Measurement System Using a Dual Amplifier with Ramp/DC Inputs and Integration," *IEEE*, 41(5), Oct. 1992.

*Primary Examiner*—Leo P. Picard
*Assistant Examiner*—David Foster
*Attorney, Agent, or Firm*—David V. Carlson; Theodore E. Galanthay; Lisa K. Jorgenson

[57] ABSTRACT

An integrated circuit package for direct mounting of an integrated circuit die to a printed circuit board is disclosed. The integrated circuit die includes a silicon sensor that detects changes in external variables, such as providing an image of a human fingerprint. The integrated circuit die has wire bond pads formed along only one side thereof to provide maximum exposure of the top surface area of the silicon sensor. The die is affixed to the printed circuit board and an adhesive surface coating, such as epoxy, is applied to the die and the printed circuit board for sealing the die thereto. The adhesive surface coating is formed from a first bead applied to the printed circuit board to cover at least the ends of the wires bonded to the board and a second bead applied to the first bead and the die to enclose the sides of the die and partially overlap the wire band pads and wires on top surface thereof.

49 Claims, 10 Drawing Sheets

PACKAGING FOR SILICON SENSORS

CROSS-REFERENCE TO RELATED APPLICATION

This application is a continuation-in-part of U.S. patent application Ser. No. 08/970,511 entitled "Packaging For Silicon Sensors," filed Nov. 14, 1997.

TECHNICAL FIELD

The present invention pertains to packaged integrated circuits, and, more particularly, to chip-on-board packaging for silicon sensors.

BACKGROUND OF THE INVENTION

Integrated circuits made from silicon are typically housed in hermetic packages, such as ceramic cavity packages or semi-hermetic plastic packages. However, new integrated circuits utilizing silicon sensors must be exposed to the environment in order to sense the desired variable. For instance, silicon sensors have been developed to sense chemicals in the air, vibrations from sound, radiation from light and color images, as well as temperature and pressure. One application of silicon sensor technology is the sensing of a fingerprint directly from the human hand.

Because silicon sensors must be exposed to the variable being sensed, typical integrated circuit packaging that encases the integrated circuit die in protective enclosures would not be feasible. Instead, the integrated circuit die must be direct mounted in a cavity package or to other substrate in order to expose the sensor to the environment. Because integrated circuits are extremely sensitive, they must be protected from damage caused by exposure to the environment without interfering with the ability to sense the desired variable.

Previous attempts to recognize fingerprint patterns used cumbersome and inefficient techniques. For example, optical sensors, while suitable for their purpose, have the disadvantages of higher power requirements to energize the light source, requiring a larger size to accommodate optical devices, such as lenses, prisms, light emitters, etc., and having a lower reliability, e.g., optical systems can be fooled by photographs. Also, protective coatings over an optical sensor device must be transparent, and reliability is compromised when such coatings become scratched or lose their transparency through exposure to sunlight and the elements. Hence, there is a need for a reliable and durable packaging of exposed silicon sensor dies.

SUMMARY OF THE INVENTION

The present invention is directed to a packaged integrated circuit that comprises a substrate, an integrated circuit die positioned on the substrate, and an adhesive surface coating applied to the substrate and the integrated circuit die for sealing the integrated circuit die and exposing a substantial portion of the top surface area on the integrated circuit die.

The first bead of adhesive surface coating extends entirely around the circumference of the integrated circuit die. The first bead is applied to the substrate and adjacent the side of the integrated circuit die, and the second bead is applied along only one side and contacts the integrated circuit die to partially overlap the top surface of the die.

The bonding pads and lead wires are positioned on a single side of the chip. The first bead contacts the substrate to seal the die to the substrate and the second bead covers the bonding pads on the semiconductor die and the lead wire ends connected to the die itself.

In accordance with one embodiment of the present invention, the first bead is applied to the substrate a predetermined distance from the integrated circuit die to form a space therebetween, and the second bead is applied in the space. Preferably, the second bead contacts the first bead and at least the sides of the integrated circuit die and partially overlaps the top surface thereof. The first bead is formed of a first type of adhesive surface coating material and the second bead is formed of a second type of adhesive surface coating material, with the first type of adhesive surface coating material having a lower viscosity when heated than the heated viscosity of the second type of adhesive surface coating material.

A unitary, packaged integrated circuit is provided, comprising a printed circuit board having one or more electrically conductive traces formed thereon. An integrated circuit die is affixed to the printed circuit board, the integrated circuit die having a top surface and sides, with a plurality of wires having a first end electrically connected to the integrated circuit die and a second end electrically connected to the traces on the printed circuit board. An adhesive surface coating is applied to the printed circuit board and the integrated circuit die to cover the wires and extend at least partially around the circumference of the integrated circuit die for sealing the integrated circuit die to the printed circuit board and exposing a substantial portion of the top surface area of the integrated circuit die.

The method of the present invention is directed to packaging an integrated circuit that comprises the steps of: positioning an integrated circuit die on a substrate; applying an adhesive surface coating to the substrate and the integrated circuit die; and heating the substrate and integrated circuit die to cause the adhesive surface coating to contact both the substrate and the sides of the die and partially overlap the top surface of the integrated circuit die and harden such that the integrated circuit die is sealed to the substrate and a substantial portion of the top surface area of the integrated circuit die is exposed.

In accordance with another aspect of the method of the present invention, the first bead is applied to the substrate and the integrated circuit die and the second bead is applied to the integrated circuit die and the first bead. The first bead is applied around the entire circumference of the integrated circuit die and the second bead extends partially around the circumference of the die. The first bead is applied to the substrate and positioned a predetermined distance from the integrated circuit die to form a space between the first bead and the integrated circuit die, and the second bead is applied to fill in the space. The second bead fills the space between the first bead and the integrated circuit die and flows partially onto the top surface of the integrated surface die when heated.

In accordance with another embodiment of the method of the present invention, the method comprises the steps of: mounting an integrated circuit die on a printed circuit board having electrically conductive traces formed thereon; bonding a first set of electrically conductive wires on only one side of the integrated circuit die and a second end of the wires to the electrically conductive traces on the printed circuit board; applying an adhesive surface coating to the printed circuit board and the integrated circuit die to cover at least the wires; and heating the printed circuit board and the integrated circuit die to cause the adhesive surface coating to flow onto the printed circuit board and the integrated circuit die and then harden such that the integrated circuit die is sealed to the printed circuit board and a substantial portion of the top surface area of the integrated circuit die is exposed.

As will be readily appreciated from the foregoing description, the present invention achieves enhanced miniaturization while mechanically supporting the silicon sensor directly on the substrate or printed circuit board. Having the wire bond pads formed along only one side of the die provides maximum exposure of the top surface area of the silicon sensor. Bonded wires are protected by the adhesive surface coating that also seals the sensor to the printed circuit board. The electrical metal layers on the top of the die are protected by a suitable coating, such as nitride, polymide, silicon dioxide, and other coatings known in the art.

Fingerprint and other biometric sensors formed in accordance with the present invention will have application in preventing the unauthorized use of cellular phones, laptop computers, automobiles, automated teller machines, credit/debit card readers, POS terminals, and smart cards. They are also useful in authenticating electronic financial transactions, personal e-mail, providing access to buildings, etc. Biometric identification, such as personal identification and authentication alternatives which could be accomplished by mounting a sensor as taught by the present invention include retinal patterns, hand or finger shape, facial shape, facial features, as well as handwriting and other genetic identification.

BRIEF DESCRIPTION OF THE DRAWINGS

The foregoing features and advantages of the present invention will become more readily appreciated as the same become better understood from the detailed description when taken in conjunction with the following drawings, wherein.

DETAILED DESCRIPTION OF THE INVENTION

Figure 1A:
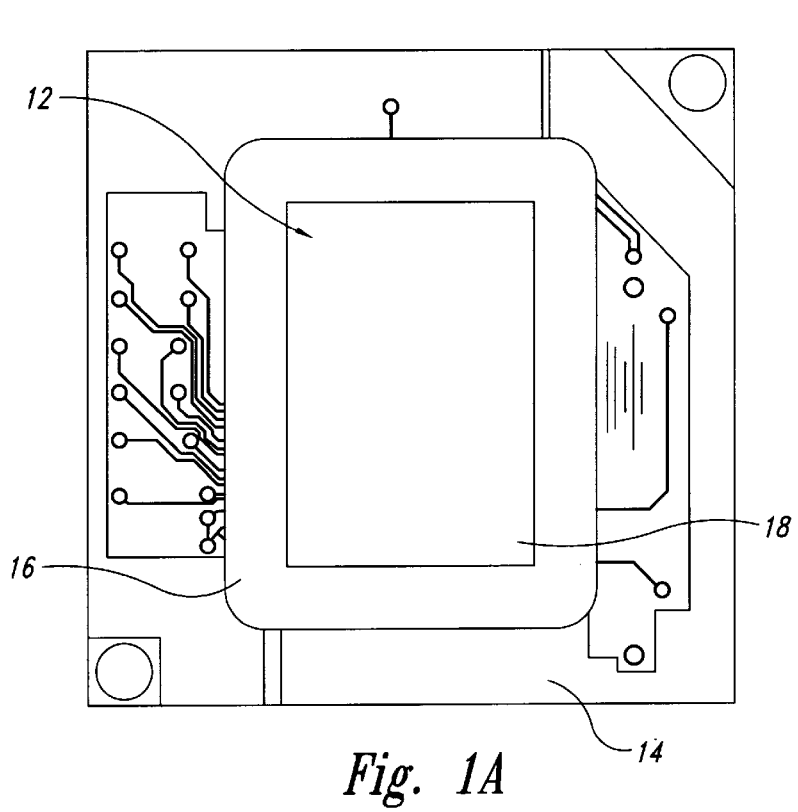
FIG. 1A is a top plan view of an integrated circuit die mounted to a printed circuit board in accordance with the present invention.
Figure 1B:
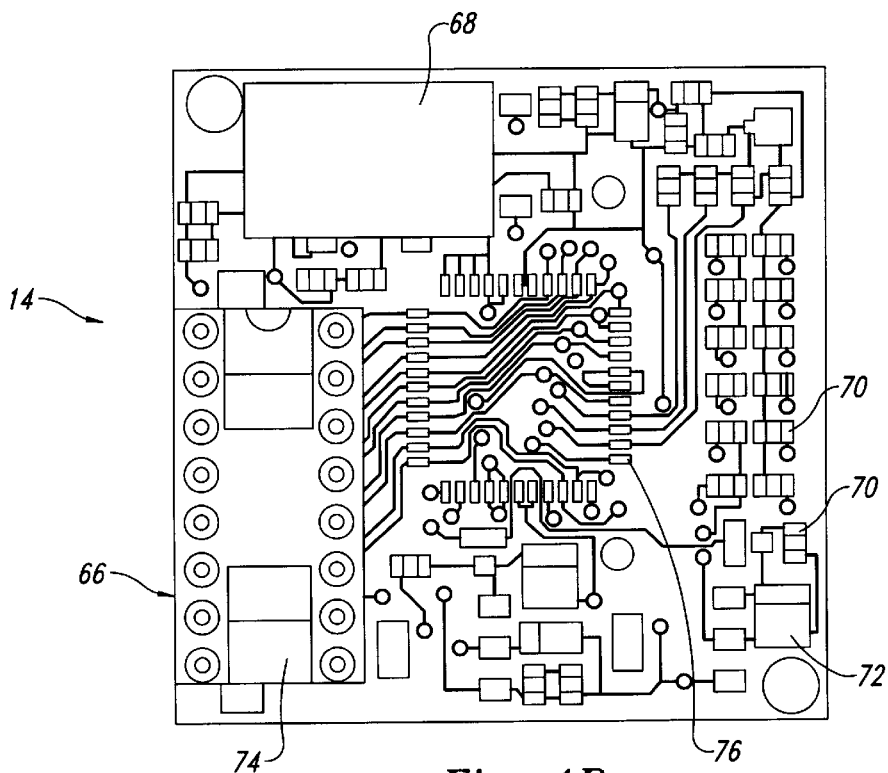
FIG. 1B is a bottom plan view of the printed circuit board of FIG. 1A.

FIGS. 1A and 1B, show an integrated circuit package 10 formed in accordance with the present invention that comprises an integrated circuit die 12 sealed to a printed circuit board 14 by an adhesive surface coating 16. While the present invention will be described in conjunction with fingerprint sensor chip architecture, it may be used for the packaging of any silicon sensors and integrated circuit devices directly to a substrate in such a way that a substantial portion of the top surface of the sensor or integrated circuit die is exposed.

Figure 2A:
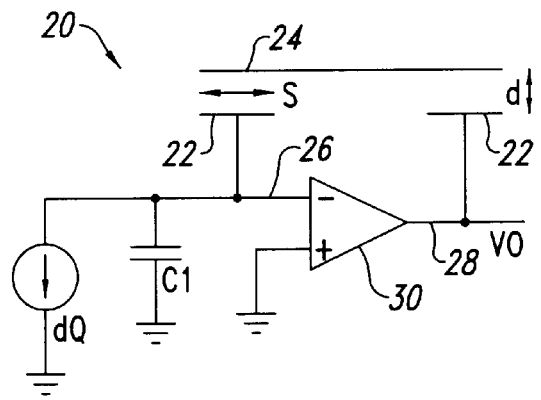
FIG. 2A is a schematic of a fingerprint silicon sensor chip formed in accordance with the present invention.
Figure 2B:
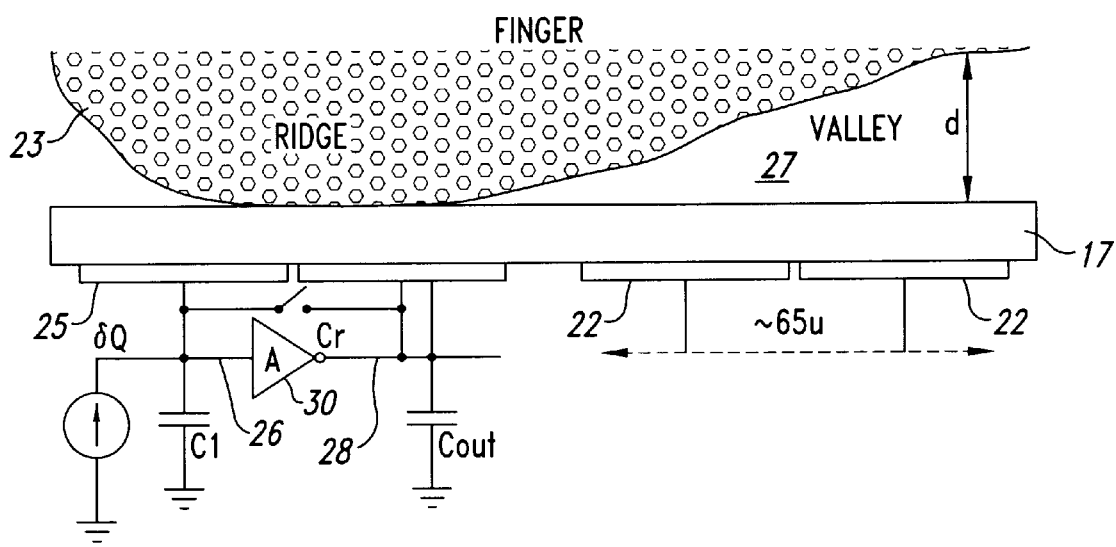
FIG. 2B is an illustration of a finger being placed on the fingerprint sensor chip of FIG. 2A.

In a preferred embodiment, the integrated circuit die 12 utilizes capacitive sensors that detect electric field variation induced by the human skin surface. A brief background discussion of the electrical sensing circuit is helpful to understand the packaging aspects of this invention. As described herein, the silicon sensor 18 is formed as part of the integrated circuit die 12. Referring to FIGS. 2A and 2B, shown therein is the cross section of two sensor cells 20 for detecting variations in the surface topography of a human finger. It is to be understood that the present invention will have application to thumbs, palms, and any contact surface where an image is desired. Two metal plates 22 are adjacently placed in the cell area and separated from the skin surface 23 by a passivation oxide or other insulating or protecting layer 17. The contact member, in this case, the skin surface 23, can be thought of as a third plate 24 that is opposed to the metal plates 22 and separated by a dielectric layer 17. The skin includes ridges 25 and valleys 27 which will each produce different capacitive coupling responses in the sensor 20. From a lumped-model point of view, this structure realizes a two series-connected capacitors scheme that can sense the difference between a contacting member, a ridge, and a non-contacting member, a valley.

The metal plates 22 are separately connected to the input 26 and output 28 of a high gain inverter 30, thus realizing a charge integrator. The cell works in two phases. First, the charge amplifier is reset, shorting the input 26 and output 28 of the inverter. During this phase, the output of the inverter settles to its logical threshold Vt. During the second phase, a fixed amount of charge dQ is sinked from the input 26, causing an output voltage swing inversely proportional to feedback capacitance value. Since feedback capacitance is inversely proportional to the distance of the skin 23, a linear dependence of output voltage on skin distance results. For a fixed amount of sinked charge, the output voltage of the inverter 30 will range between two extremes, depending on feedback capacitance value: (i) the upper saturation level if no feedback capacitance is present; (ii) a value close to the logical threshold when the feedback capacitance is large.

Even if a linear response is expected, the inverter 30 gain and the parasitic capacitance of the input reduce the linearity of the characteristic. In fact, for a limited gain A of the amplifier, the output swing is given by:

$$\Delta V_o = \delta Q1 \left[ \frac{C_i}{A} + \left(1 + \frac{1}{A}\right) C_r \right]$$

where $C_r$ is the sensed feedback capacitance, composed of the sum of a fixed parasitic capacitance and a variable one to be sensed, and $C_1$ is the parasitic input capacitance.

Figure 3A:
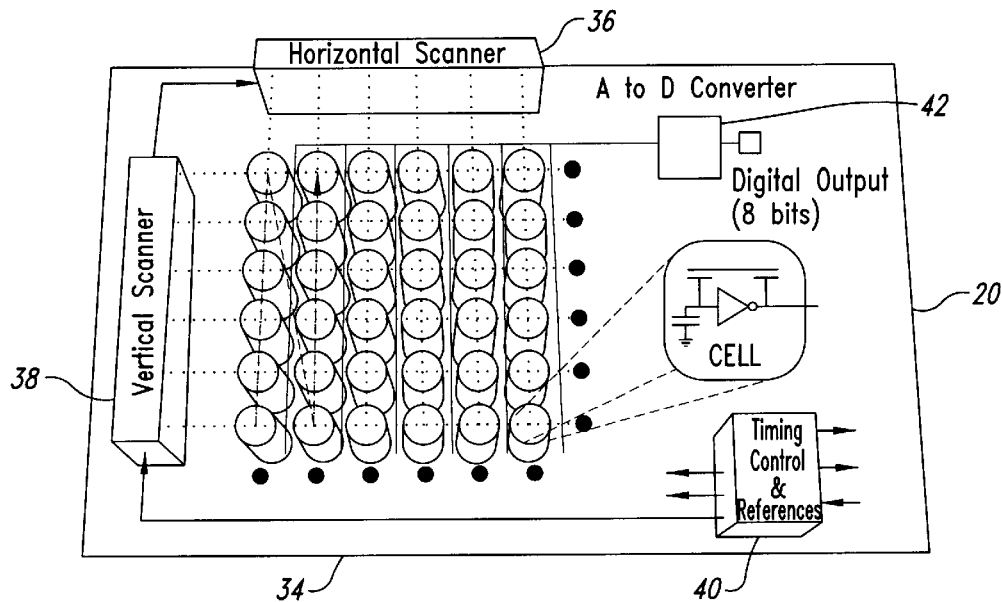
FIG. 3A is an illustration of the fingerprint sensor chip architecture formed in accordance with the present invention.
Figure 3B:
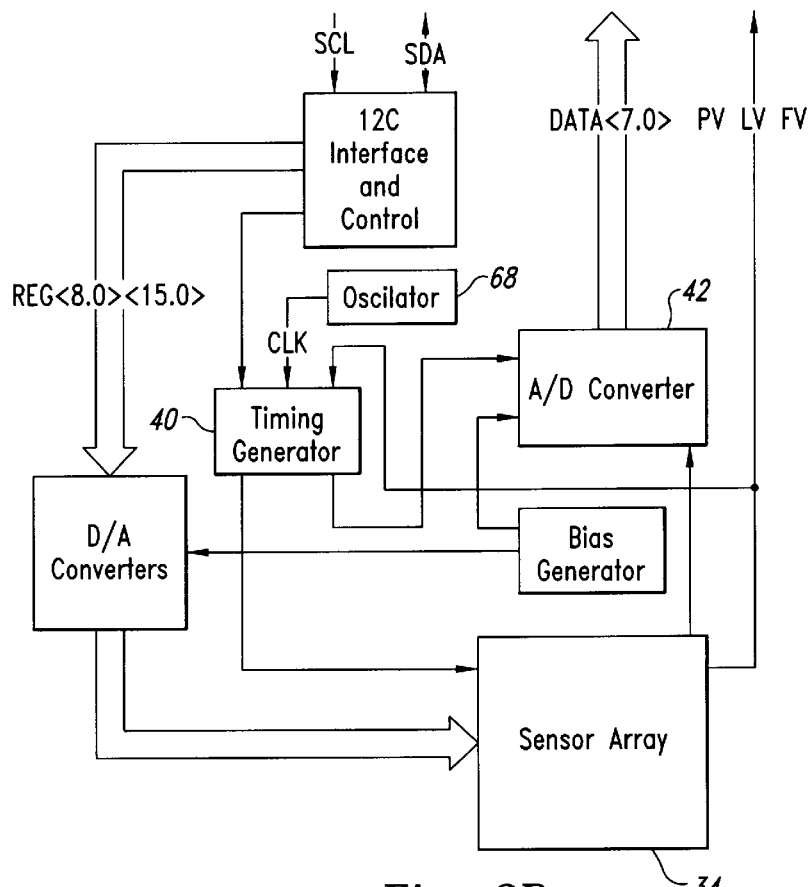
FIG. 3B is a block diagram of the sensor of FIG. 3B formed in accordance with the present invention.

An illustration of the fingerprint chip architecture is shown in FIG. 3A, and a block diagram of the sensor 18 FIG. 1A is shown in FIG. 3B. An array of cells 34 is addressed in a raster mode by means of horizontal and vertical scanners 36, 38. Also included on the chip is a timing control and voltage references 40, and an A-to-D converter 42 for converting the output to 8-bit digital format. Additional circuits are present on the chip to provide the necessary I/O and chip control functions.

Figure 4:
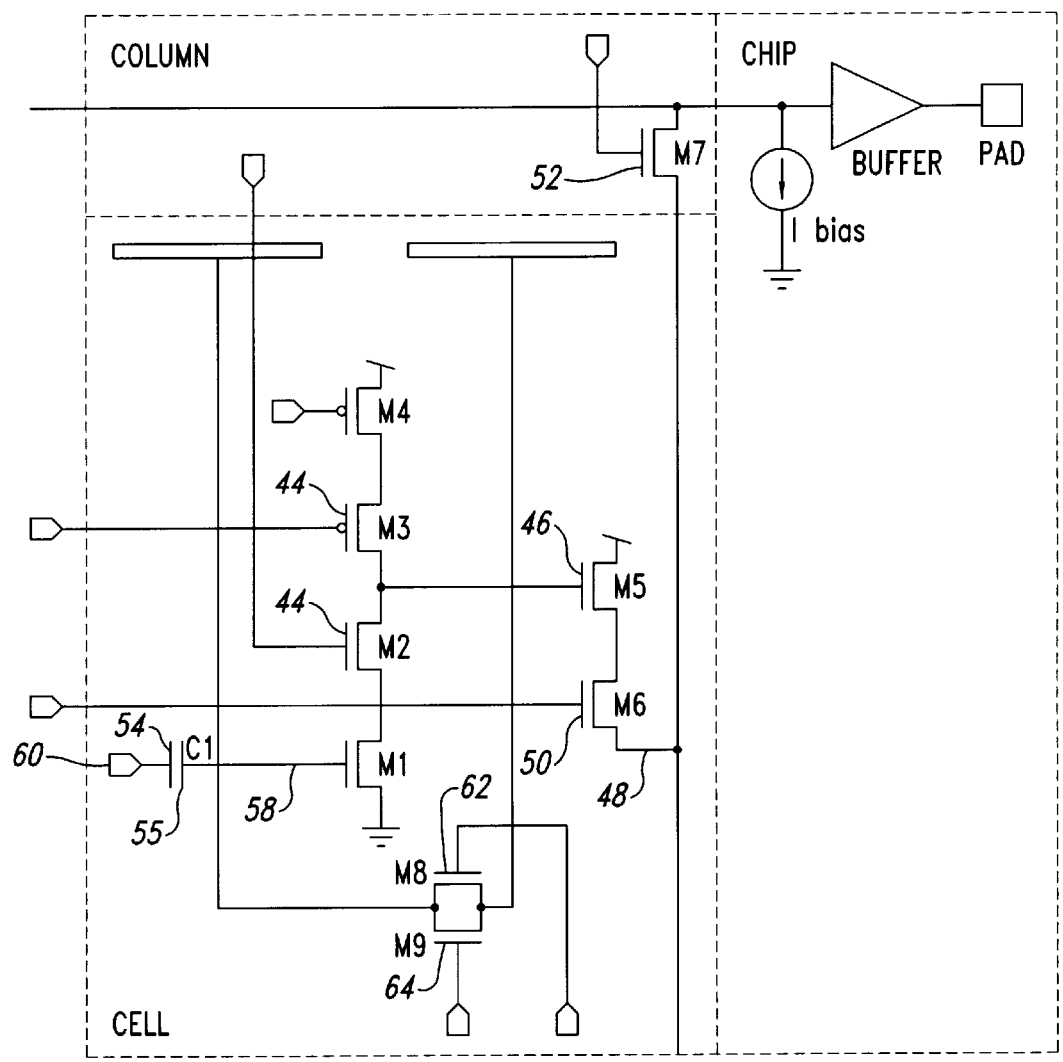
FIG. 4 is a schematic of a fingerprint sensor cell circuit formed in accordance with the present invention.

A detailed schematic of the cell is illustrated in FIG. 4. Two transistors 44 (M2 and M3) of the high-gain cascade inverter type are used for addressing purposes, limiting power consumption of non-addressed cells. The output is buffered by a source follower stage 46 (M5) into a vertical output line 48 by means of a transistor 50 (M6). The transistor 52 (M7), which is addressed by a horizontal shift register, greatly reduces output capacitance of the follower stage 46 since only one vertical line is shorted to the global output. Two plates 54, 55 of a very small capacitance $C_1$ are connected to the input and to a node common to the entire array, respectively. When a negative voltage step $\Delta V_i$ is applied to the global node, a charge amount $dQ=C_i\Delta V_i$ is sinked from the amplifier input as previously explained. This mode of operation is useful since by changing the amount of $\Delta V_i$, the sensor can deal with different ranges of sensed capacitances.

The turning-off phase of the reset transistor 62 (M8) is selected to ensure proper operation. If the switch-off transient of the reset transistor 62 is slow enough compared to the inverse of the gain bandwidth product of the inverter, most of the channel charge of the reset transistor 62 is injected into the output node. The size of the switch transistor 64 (M9) is small in order to reduce the absolute amount of injected charge. Reducing the dimension of the switch transistor 64 degrades the stability of the amplifier since it reduces the loop gain-bandwidth. In this design, a second stronger switching transistor 64, activated at a different phase than the reset transistor 62 is introduced. During the reset phase, both transistors 62, 64 are set, reducing resistance of the feedback loop so output ringing is contained. During charge integration, the switch transistor 64 is first opened so its channel charge is absorbed by the reset transistor 62. Finally, the reset transistor 62 is opened by a slow gate transient to ensure low charge-injection on the input.

Figure 5:
FIG. 5 is an image of a fingerprint obtained from the fingerprint sensor of the present invention.

In a preferred embodiment, the chip is made using a 0.7 $\mu$m CMOS digital process. The cell area is 65×65 $\mu m^2$, giving a 390 dpi resolution. A sample image 65 produced for a 200×200 window is shown in FIG. 5, which clearly shows grey levels. The image disappears as the finger is removed. The power consumption measured at 3 $\mu$s of a period cycle is 250 $\mu$W for the digital circuitry and 300 $\mu$W for the cell array 34 and buffer.

The sensor cells 20 described above are preferably formed using conventional silicon integrated circuit methodology. More particularly, the capacitors, transistors, and other circuit components are formed on a large wafer that includes a large number of integrated circuit die 12.

After the wafer having a large number of integrated circuit die 12 is formed using conventional processes, the top surface 76, which contains the sensor cells 20, is protected with a coating 78 to provide a passivation layer and act as a dielectric semiconductor layer. Silicon dioxide, silicon nitride, or other known coatings may be used to provide a passivation layer. Other suitable passivation layers include BSPG, a polymer such as one type that provides alpha shielding as well as passivation, a deposited doped oxide, or other material. In one embodiment, the coating 78 is a composite layer or sandwich layer of preferred materials. For example, a layer of silicon dioxide on top of the silicon nitride, or vice versa, may be used. If extra hardness is required, the coating 78 can be graphite or diamond. Silicon dioxide, silicon nitride and other materials are also transparent so that light may be received by the sensor if that is the type of sensor being used. However, for a capacitive sensor the protective coating need not be transparent. An opaque coating is used in one embodiment. The coating 78 has sufficient thickness to protect the die 12 from weather, oil, water, dust, and extreme temperatures. It protects the sensor components 18 from electrical shorts as well as prevent damage from scratches or mechanical contact. The coating is designed to be thin enough to permit capacitive coupling and electrical interaction to sense the difference between the valleys 27 and ridges 25 of the finger 23. A protective coating of silicon nitride having a thickness of less than 2 microns, usually within the range of 5000 Å to 20,000 Å is preferred. A thickness of 10,000 Å has been found acceptable.

If the coating is silicon dioxide, or a sandwich of layers, or some other material, it may be thinner or thicker, depending on the thickness that permits sensing while protecting the circuit from electrical, mechanical and weather influences.

Following application of the coating 78 on the entire top surface 76 of the wafer, the integrated circuit wafer is etched with scribe lines along which the wafer will be cut. This is done before cutting and after the coating 78 is applied. Etching before cutting avoids damage to the top coating on each die due to edge distortion in the cutting process. After etching through the top layer between the individual dies, the individual die 12 is cut. The die is then bonded to the printed circuit board 14 with the top surface 76 exposed. More particularly, the back surface 80 of the die 12 is bonded to the printed circuit board 14 using a conductive epoxy or other bonding material. The process for such is known in the art. In one embodiment, the etching along the scribe line continues to the base silicon, with all of the layers being etched as well, while in other embodiments, only the upper passivation layer 78 is etched.

The design of the printed circuit board and placement of the chip on the board is selected to achieve certain purposes of the invention. The circuit board has a large number of conductive traces 92 thereon, many of which are exposed to form conductive contact pads, sometimes called bonding fingers. A lead wire extends from the chip to the contact pads. The contact pads are to positioned to be closely adjacent the chip when the chip is affixed to the printed circuit board 14. The contact pads are close enough that a single bead of epoxy can cover the contact pads and also be adjacent the chip, and in some embodiments, touch the chip. Thus, the contact pads are spaced within about 10–60 mils from the side of the die, the preferred spacing being in the range of 20–30 mils. In one embodiment, the contact pads are over 60 mils from the die and a larger bead is formed to cover them, as explained in more detail elsewhere herein.

As shown in FIGS. 6A–6D, the integrated circuit die 12 has bond pads 82 formed along one edge 84 only. This conserves the top surface area of the die 12 for maximum exposure. Individual wires 86 are then attached, with the first ends 88 of the wires electrically connected to the bond pads 82 on the die 12 and the second ends 90 electrically connected to the conductive traces 92 on the printed circuit board 14, as shown more clearly in FIG. 6D.

Following connection of the wires 86, the die 12 is sealed to the printed circuit board by application of an adhesive surface sealant 79. An epoxy, such as Hysol 4451, or 4450 or other material generally known in the art and commercially available may be used. The sealant 79 serves to protect and seal the die 12, wires 86, and electrical connections from mechanical or electrical damage and corrosion due to weather conditions.

Figure 6A:
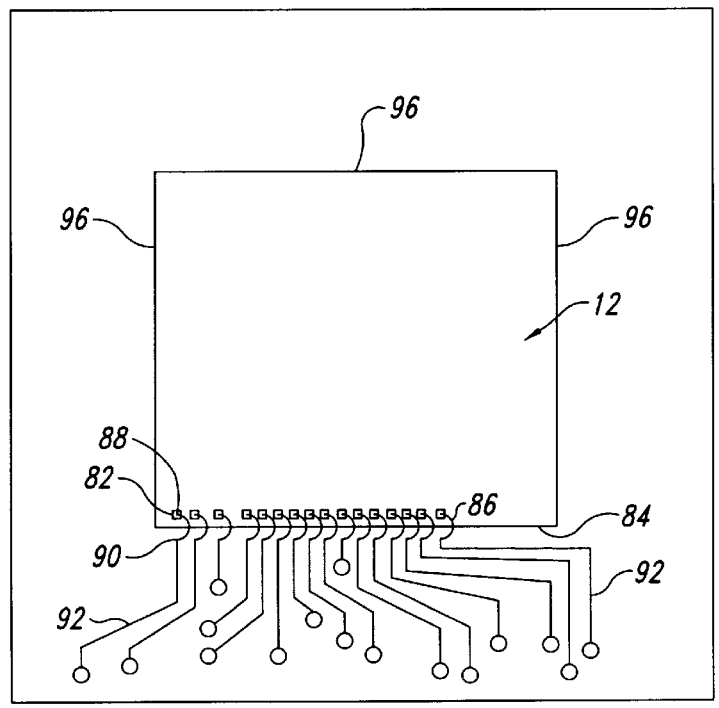
FIGS. 6A–6D illustrate a method of packaging a chip-on-board silicon sensor in accordance with one embodiment of the present invention.
Figure 6B:
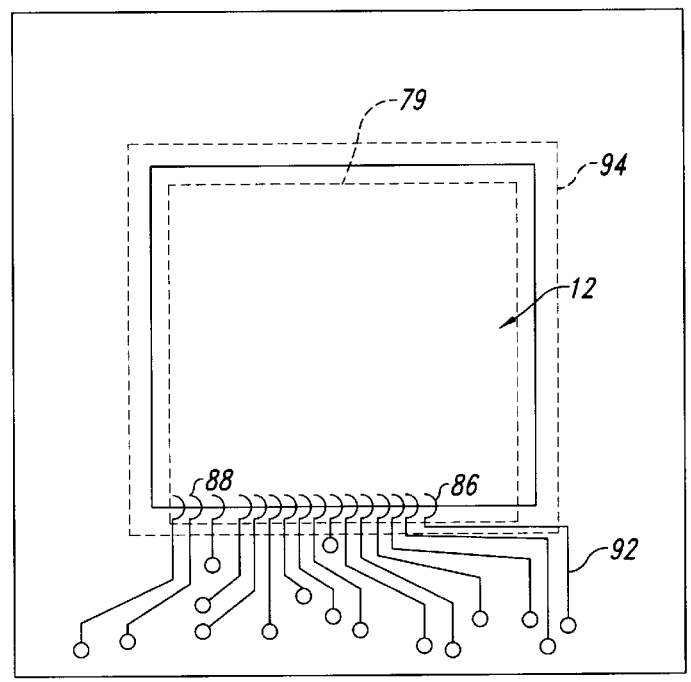
Figure 6C:
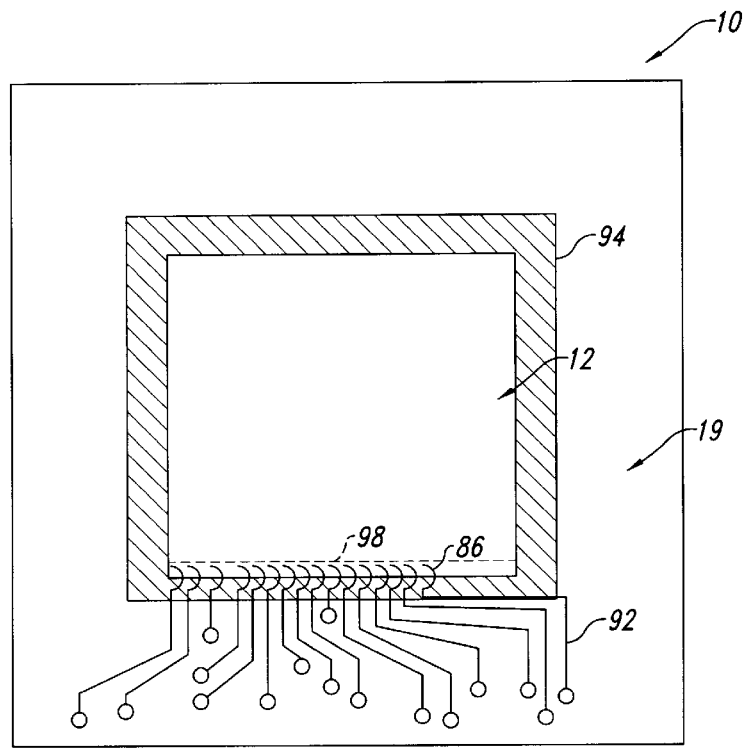
Figure 6D:
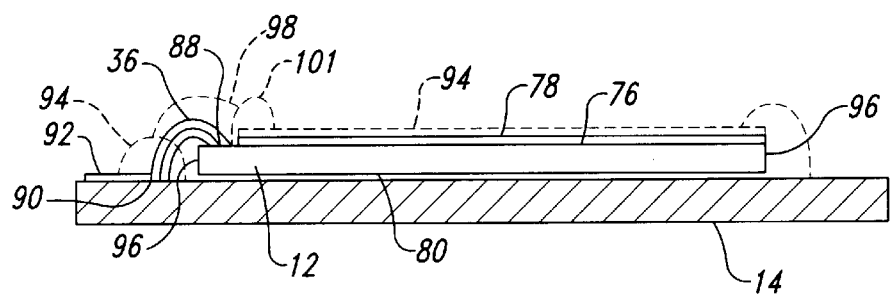

As shown in FIGS. 6B and 6D, the sealant 79 is preferably applied in a first pass that goes completely around the edge of the chip. A second pass is made on the side or sides of the chip having lead wires and bonding pads. A first pass creates a first bead 94, as shown in dotted lines. In one embodiment, the first bead 94 is started on a side of the die that does not include the bonding pads 82. Preferably, it is on a side adjacent to the guide having the bonding pads of the die 12 where the wires 86 are attached. As the bead is applied, it is positioned in close proximity to the side 96 of the die 12 but spaced a slight distance away. The application of the first bead 94 continues around the other three sides 96 of the die 12 such that the first bead 94 is applied to the printed circuit board 14 and may slightly touch the die 12. When a side having lead wires is being coated, the position is selected to cover the lead wire and the circuit board contact pad. Preferably, the first bead 94 encloses the side 96 and partially overlaps the top surface 76 of the die 12. After this first bead 94 is applied, as shown in FIG. 6C, a second bead 98 of epoxy is applied to overlay the edge 84 of the die 12 that has bonding pads to cover the first end 88 of the wires 86. More particularly, the second bead 98 is applied such that it is adjacent to and may overlap the first bead 94 and overlays the top surface of the die 12 along any side having bonding pads. As shown in the cross-sectional side view of FIG. 6D, the first bead seals the die 12 against the printed circuit board 14, while the second bead covers the edge 84 to fully enclose the first ends 88 of the wires 86 and cover the bonding pads 82 and the wires. Both beads together thus completely enclose the wires 86 while not covering most of the top surface of the die. While the first bead can be applied at least partially around the circumference of the die 12, it is preferably applied completely around the circumference of the die 12. However, the second bead 98 is preferably applied only along the edge 84 of the die 12 where the wires 86 are bonded.

Following application of the first and second beads 94, 98, the entire package 10 is heated to a temperature in the range of 140 degrees to 180 degrees, and more preferably to 160° C. for approximately 1.0 to 1.5 hours. Upon heating, the epoxy sealant 79 wicks or flows out, ensuring that all voids are filled in and a complete seal is achieved. As heating continues, the epoxy bakes to a hardened state.

Figure 7A:
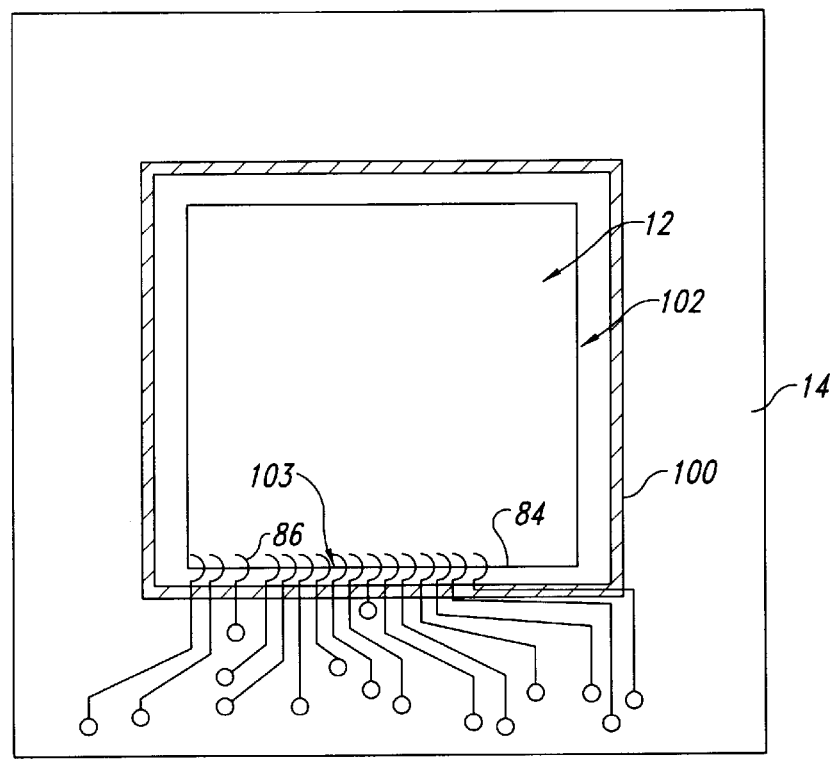
FIGS. 7A–7D illustrate alternative methods of packaging a chip-on-board silicon sensor in accordance with the present invention.
Figure 7B:
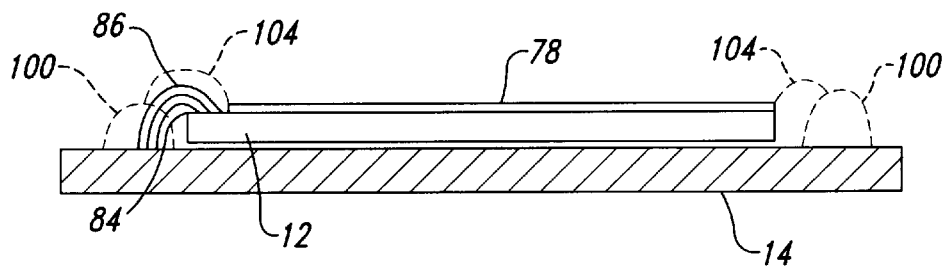

In another embodiment, which is illustrated in FIGS. 7A–7B, the sealant 79 is applied in two steps, with the first step involving application of a dam bead 100. This bead 100 is applied around the chip and overlays the second ends 90 of the wires 86 on the printed circuit board similar to the first embodiment depicted in FIGS. 6A–6D. When applied around the sides 96, the bead 100 is positioned a predetermined distance away from the sides 96 to form a space 102. The bead 100 may be applied partially around the circumference of the die 12 and leave one or more gaps in the bead or may be applied around the entire circumference of the die 12, as shown in FIG. 7A. An intermediate dam bead 101 can be applied to the bond pad area 103.

Figure 7C:
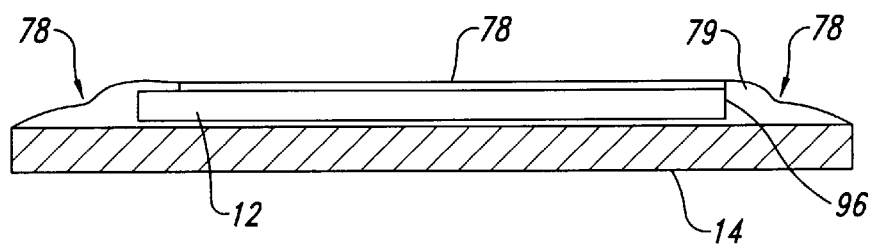
Figure 7D:
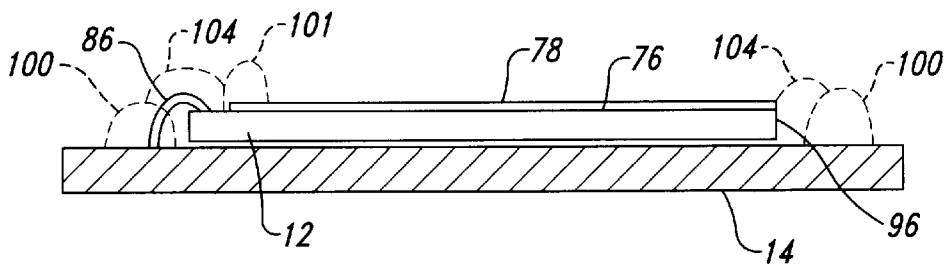

The fill layer or second bead 104 of epoxy is applied in the space 102 created between the dam bead 100 and the die 12. Ideally, the second bead 104 completely covers the space 102 and overlaps the dam bead 100 and the sides 96 of the die 12. Upon heating, the first and second beads 100, 104 initially wick or flow out such that the second bead 104 partially overlaps the top surface 76 of the die 12, as is shown in FIG. 7C. The intermediate dam bead 101 is applied adjacent the first ends 88 of the wires 86 to prevent the second bead 104 from flowing onto the sensor cells 20, as shown in FIG. 7D.

In this second embodiment, the dam bead 100 and fill bead 104 have different viscosities. The dam head 100 is formed from Hysol 4451 epoxy, while the fill bead 104 is formed from Hysol 4450 epoxy. The Hysol 4450 epoxy used for the second bead 104, has a greater wicking effect and is much less viscous under high temperature that results in a higher heated flow rate than the Hysol 4451 at the same temperature. This facilitates complete filling of the space 102 by the second bead 104. To ensure complete filling of all voids by the sealant 79, the coated package 10 is subjected to a vacuum, which removes pockets of air that may be trapped between the sealant 79 and the wires 86 or the edges of the die 12.

With either of the methods described above, sealing of the die 12 to the printed circuit board 14 is quickly and efficiently accomplished with few passes of the epoxy sealant 79. One method for efficiently applying the sealant 79 is to begin the application of the first bead adjacent the edge 84 of the die where the wires 86 are located. For example, referring to FIGS. 8 and 9A, point A is the starting point of a first bead 106. A nozzle 108, which is known to those skilled in the art and readily commercially available, is used to apply the sealant 79. The application of the sealant 79 can be easily automated by programming a dispensing equipment, such as the CAM/ALOT 3000, which is readily commercially available. The nozzle 108 is positioned above the board 14 a distance d1, usually in the range of 10 to 80 thousands of an inch (mils), and more preferably about 50 mils. The die 12 in this case is about 30 mils thick, but a thicker die may be employed with the height d1 being adjusted as needed.

The nozzle 108 begins application of the first bead 106 at point A and moves clockwise around the circumference of the die 12 through points B, C, D, and E, returning back to point A.

Figure 9A:
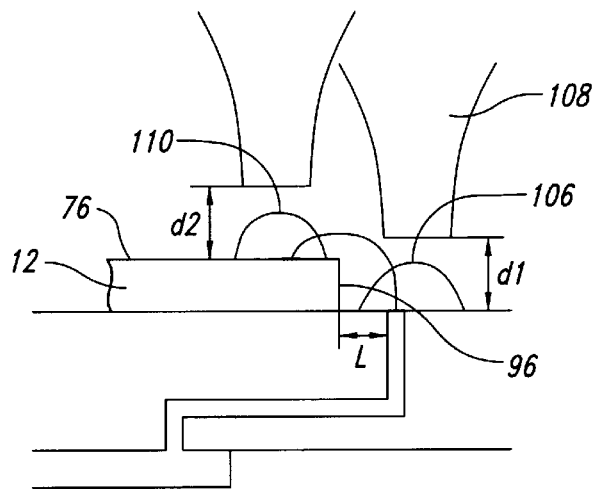
FIGS. 9A–9C are cross-sectional views of various embodiments for depositing the adhesive bead.

Once the nozzle returns to the starting point A, it is then raised to a new height of sufficient distance d2 above the die 12 that the wires 86 will not be broken or damaged through direct contact with the nozzle 108 or by contact with the sealant 74 as it is ejected from the nozzle 108. The nozzle 108 should be positioned above the die 12 a distance d2 in the range of 5 to 80 miles, and ideally 10 mils. It is directly over the bonding pads as shown in FIG. 9A, or can be slightly offset if desired. The nozzle 108 then performs a second pass to apply the second bead 110 in the horizontal line from point A to D.

The second bead 110 is applied to the die 12 in sufficient thickness to cover the wires 86. As shown in FIG. 9A, the second bead 110 covers the top surface 76 from the first end 88 of the wires 86 to the end of the top surface 76, although it could also overlap the first bead 106 to ensure complete coverage. The nozzle 108 applies the second bead 110 by moving across the edge 84 of the die 12 from point A to point D. Thus, the nozzle does not have to be moved to a new starting point for the second bead 110.

Figure 8:
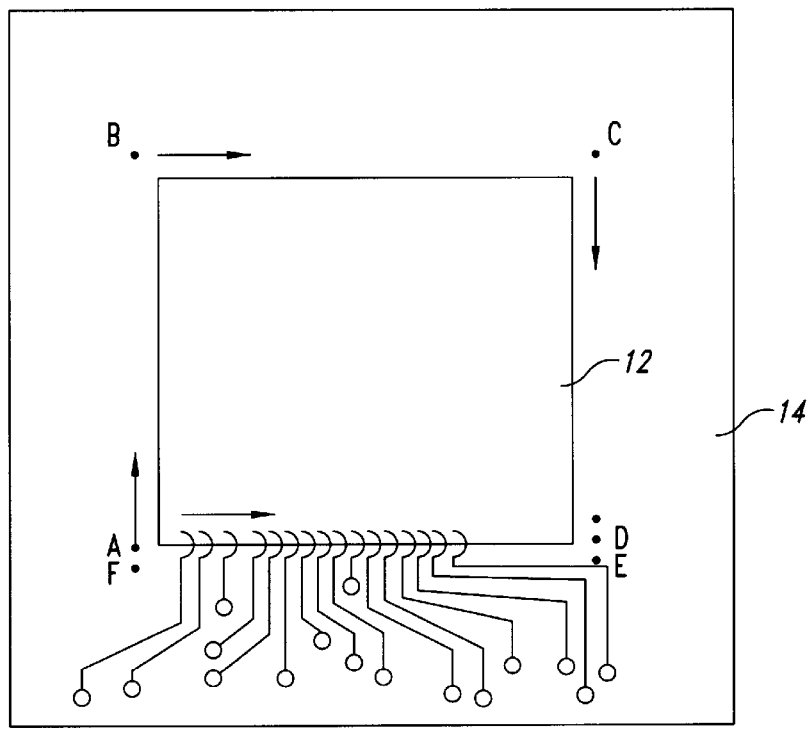
FIG. 8 is a top view of one possible pattern for depositing an adhesive bead.

In the embodiment illustrated in FIG. 8, the wires 86 are not positioned along the entire edge 84. Consequently, the nozzle 108 could stop at point G and terminate the application of the second bead 110 at this point, assuming the first bead 106 has sufficiently sealed the remaining portion of the edge 84.

The nozzle 108 could be positioned to start at other points and achieve a similar efficiency. For instance, the nozzle 108 could start at point D and travel around the circumference of the die 12 in either a clockwise or counterclockwise direction. Upon completion of the first pass, the nozzle 108 would make a lateral side step from point D to point E, where the second pass would begin. The second pass would then end at point A. Alternatively, the second pass could, if desired, continue around the entire circumference of the die 12, being applied to the first bead 106 and partially overlapping the top surface 76 of the die 12. Finally, in the embodiment using the intermediate dam bead 101, the first bead 100 could have a break formed in the two locations where the dam bead 101 intersects, thus preventing excessive accumulation of sealant 79 at these points.

Figure 9B:
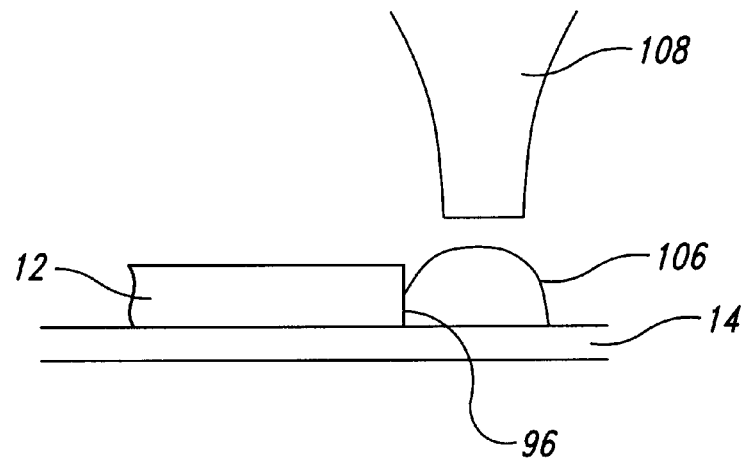
Figure 9C:
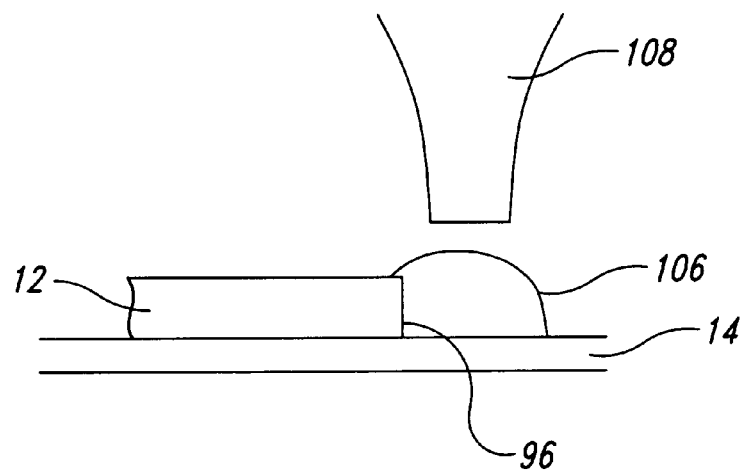

FIGS. 9A–9C illustrate different positions for the first bead. According to the embodiment as shown in FIG. 9A, the first bead is spaced somewhat from the die such that it does not contact the die at all when initially deposited. The nozzle is held a distance d1 from the printed circuit board and deposits the bead so as to cover the contact pads on the circuit board and a portion of the wires. The contact pads are spaced a distance L away from the semiconductor die, the distance L being selected such that the bead will be closely adjacent the die and also cover the contact pad and a portion of the lead wire.

In an alternative embodiment shown in FIG. 9B, the first bead is sufficiently close to the die that a portion of it is adjacent the die so as to contact a sidewall of the die while a majority of the bead is on the PC board. FIG. 9C is a further alternative embodiment in which the bead is positioned to overlap a top layer of the die, completely enclose the side, and also contact the printed circuit board.

The embodiments as shown in FIGS. 9A–9C illustrate the position of the bead as initially deposited. Of course, the size and position of the bead will change considerably after heating and being cured. For example, in the embodiment of FIGS. 9A and 9B the heating of the substrate will cause the epoxy to flow and overlay the upper surface of the die, as well as cover the side. Thus, even though the initial bead does not overlay the top surface of the die, during the heating and curing step, the epoxy will wick against the side of the die so as to completely cover it. The embodiments of FIGS. 9A and 9B have the significant advantage that to the natural wicking process the entire side of the die is sealed, as is a small portion of the top surface. However, the majority of the surface of the die is not covered to expose a substantial portion of the die except at the very edge where the sealing bead is positioned.

FIG. 9A illustrates a further embodiment of the present invention that includes improved security for the sensor.

The conductive leads of the circuit board 14 are positioned and formed internally to the circuit board 14. The forming and subsequent lamination of such conductive traces 92 is well known in the art generally. However, its application to this particular technology is not known. According to this embodiment, the encryption software and hardware is all included within a single package. The microcontroller on the back side of the package includes in encrypted form all of the authorization codes and fingerprint identification data. There is no open connection available that a probe could be used to contact to obtain a signal that is transmitted from the sensor to the semiconductor chip. Many prior art devices have an electrical connection that extends from the sensor device to the microprocessor or storage of the authorization data, thus providing a weak link in the system that pirates may access in order to override the security aspect of the system and directly access the microprocessor. Such an access is impossible with the present invention. There is no open connection that a probe can get to without destroying the sensor die and the printed circuit board. The connection between the sensor and the chip is completely embedded underneath the sensor itself and emerges only directly underneath the chip. The data stream cannot be accessed without destruction of the sensor and the chip. Therefore, the output from the entire packaged printed circuit board 10 therefore does not have any of the encryption data nor the authorization access code information. By including all the circuit components in a single semiconductor package, the security system is significantly enhanced. Additionally, if a pirate attempts to dissolve the epoxy that covers the lead frames, the same etchant which would etch the epoxy beads 94 and 100 also will completely etch and dissolve the epoxy which comprises the printed circuit board. This will completely destroy the electrical connections and the printed circuit board holding the wires so that all wires will be shorted together and the original routing of the signals cannot be determined. This provides a further security measure in the event of would-be pirate attempts to circumvent the system in order to access the lines.

The above-described method of mounting the silicon sensor 18 provides a sealed chip-on-board sensor system in one integrated circuit package 10. More particularly, the reverse side 66 of the printed circuit board 14 includes one or more microchips, such as an oscillator 68, passive elements, such as capacitors 70, a voltage regulator 72, and a connector 74. The top surface 76 can be used for a micro processor or microcontroller that enables outputting of an image, confirmation or authorization data, and other information to peripheral devices. The microcontroller can include memory for storing fingerprints, security codes, and algorithms for comparison and verification of fingerprints or other sensed data. Memory registers, such as DRAMs or EEPROMs, can be included in the microcontroller to enable programming of additional authorized fingerprints or removal of authorized fingerprints. The connector 74, shown in FIG. 1B, or suitable alternative, is included on the board 14 for connection to output devices. Thus, the present invention contemplates a method for making and packaging of all necessary components for a fully functional silicon sensor system.

While a preferred embodiment of the invention has been illustrated and described, it is to be understood that various changes may be made therein without departing from the spirit and scope of the invention. For example, the wires 86 may be attached to more than one edge of the die 12, such as along two, three, or all of the edges, as desired, although the preferred embodiment has the wires 86 attached only along the edge 84 as described. The step of heating may include the application of heat after each bead is laid down, although this is inefficient for mass production. The adhesive surface coating may also take the form of a premolded seal or plastic frame that is placed over the edges of the die 12 and bonded in place with heat, adhesive, or other suitable bonding agent. Thus, the invention is to be limited only by the scope of the claims that follow.

The embodiments of the invention in which an exclusive property or privilege is claimed are defined as follows:

1. A packaged integrated circuit, comprising:
   a substrate;
   an integrated circuit die positioned on said substrate, said integrated circuit die having a top surface and sides; and
   an adhesive surface coating applied to said substrate and said sides of said integrated circuit die for sealing said integrated circuit die to said substrate such that a substantial portion of said top surface of said die is exposed.

2. The integrated circuit of claim 1 wherein said adhesive surface coating comprises a first bead of adhesive surface coating and a second bead of adhesive surface coating, said first and second beads extending at least partially around the circumference of said integrated circuit die.

3. The integrated circuit of claim 2 wherein said first bead of adhesive surface coating extends entirely around the circumference of said integrated circuit die.

4. The integrated circuit of claim 3 wherein said first bead is applied to said substrate and said integrated circuit die and said second bead is applied to said first bead and said integrated circuit die to extend at least partially around said integrated circuit die.

5. The integrated circuit of claim 3 wherein said first bead is applied to said substrate a predetermined distance from said integrated circuit die to form a space therebetween, and further wherein said second bead is applied in said space.

6. The integrated circuit of claim 5 wherein said second bead contacts said first bead and said integrated circuit die.

7. The integrated circuit of claim 1 wherein said coating partially overlaps said top surface of said integrated circuit die.

8. The integrated circuit of claim 6 wherein said first bead is formed of a first type of adhesive surface coating material and said second bead is formed of a second type of adhesive surface coating material.

9. The integrated circuit of claim 8 wherein said first type of adhesive surface material has a lower flow rate when heated than the heated flow rate of said second type of adhesive surface coating material.

10. The integrated circuit of claim 9 wherein said second bead extends entirely around the circumference of said integrated circuit die.

11. A packaged integrated circuit, comprising:
a printed circuit board having one or more electrically conductive traces formed thereon;
an integrated circuit die affixed to said printed circuit board, said integrated circuit die having a top surface and sides, and a plurality of wires having a first end electrically connected to said integrated circuit die and a second end electrically connected to said traces on said printed circuit board; and
an adhesive surface coating applied to said printed circuit board and said sides of said integrated circuit die to extend at least partially around the circumference of said integrated circuit die for sealing said integrated circuit die to said printed circuit board such that a substantial portion of the surface area of said top surface of said integrated circuit die is exposed.

12. The integrated circuit of claim 11 wherein said wires are electrically connected along only one side of said integrated circuit die.

13. The integrated circuit of claim 11 wherein said adhesive surface coating comprises a first bead of adhesive surface coating and a second bead of adhesive surface coating.

14. The integrated circuit of claim 13 wherein said first bead of adhesive surface coating extends entirely around the circumference of said integrated circuit die.

15. The integrated circuit of claim 14 wherein said first bead is applied to said printed circuit board and at least said sides of said integrated circuit die to cover at least said second end of said wires connected to said printed circuit board, and said second bead is applied to said first bead and said integrated circuit die to extend at least partially around said integrated circuit die and partially overlap said top surface to cover at least said first end of said wires connected to said integrated circuit die.

16. The integrated circuit of claim 13 wherein said first bead is applied to said printed circuit board a predetermined distance from said integrated circuit die to form a space between said first bead and said integrated circuit die, and further wherein said second bead is applied in said space.

17. The integrated circuit of claim 16 wherein said second bead contacts said first bead and at least said sides of said integrated circuit die.

18. The integrated circuit of claim 11 wherein said second bead partially overlaps said top surface of said integrated circuit die.

19. The integrated circuit of claim 17 wherein said first bead is formed of a first type of adhesive surface coating material and said second bead is formed of a second type of adhesive surface coating material.

20. The integrated circuit of claim 19 wherein said first type of adhesive surface material has a lower flow rate when heated than the heated flow rate of said second type of adhesive surface coating material.

21. The integrated circuit of claim 20 wherein said second bead extends entirely around the circumference of said integrated circuit die.

22. A method for packaging an integrated circuit, comprising the steps of:
positioning an integrated circuit die on a substrate;
applying an adhesive surface coating to the substrate and a circumferential edge of the integrated circuit die; and
heating the substrate and integrated circuit die to cause the adhesive surface coating to flow onto the substrate and the integrated circuit die and harden such that the integrated circuit die is sealed to the substrate and a substantial portion of the top surface of the integrated circuit die is exposed.

23. The method of claim 22 wherein said step of applying an adhesive surface coating comprises applying a first bead of adhesive surface coating at least partially around the circumference of the integrated circuit die and applying a second bead of an adhesive surface coating at least partially around the circumference of the integrated circuit die.

24. The method of claim 23 wherein the first bead is applied to the substrate and the integrated circuit die, and the second bead is applied to the integrated circuit die and the first bead.

25. The method of claim 24 wherein the first bead is applied around the entire circumference of the integrated circuit die.

26. The method of claim 23 wherein the first bead is applied to the substrate and positioned a predetermined distance from the integrated circuit die to form a space between the first bead and the integrated circuit die, and the second bead is applied to fill in the space.

27. The method of claim 26 wherein the second bead fills the space between the first bead and the integrated circuit die and flows partially onto the top surface of the integrated surface die when heated.

28. The method of claim 27 wherein the second bead extends around the entire circumference of the integrated circuit die.

29. A method for packaging an integrated circuit, comprising the steps of:
mounting an integrated circuit die having sides and top and bottom surfaces on a printed circuit board having electrically conductive traces formed thereon;

bonding a first end of electrically conductive wires to the integrated circuit die and a second end of the wires to the electrically conductive traces on the printed circuit board;

applying an adhesive surface coating to the printed circuit board and the sides of the integrated circuit die to cover at least the wires; and heating the printed circuit board and the integrated circuit die to cause the adhesive surface coating to flow onto the printed circuit board and the integrated circuit die and then harden such that the integrated circuit die is sealed to the printed circuit board and a substantial portion of the top surface of the integrated circuit die is exposed.

30. The method of claim 29 wherein the wires are attached to only a single side of the integrated circuit die.

31. The method of claim 29 wherein said step of applying an adhesive surface coating comprises applying a first bead of adhesive surface coating at least partially around the circumference of the integrated circuit die and applying a second bead of an adhesive surface coating at least partially around the circumference of the integrated circuit die.

32. The method of claim 31 wherein the first bead is applied to the printed circuit board and the integrated circuit die to cover at least the second ends of the wires, and the second bead is applied to the integrated circuit die to cover at least the first ends of the wires.

33. The method of claim 32 wherein the first bead is applied around the entire circumference of the integrated circuit die.

34. The method of claim 33 wherein the first bead is applied to the printed circuit board and positioned a predetermined distance from the integrated circuit die to form a space between the first bead and the integrated circuit die, and the second bead is applied in the space formed between the first bead and the integrated circuit die.

35. The method of claim 34 wherein the second bead fills the space between the first bead and the integrated circuit die and flows partially onto the top surface of the integrated surface die when heated.

36. The method of claim 35 wherein the second bead extends around the entire circumference of the integrated circuit die.

37. The method of claim 33, wherein the second bead is positioned a predetermined distance from the first bead to create a spare there between.

38. The method of claim 37 wherein a third bead is applied in the space between the second bead and the first bead.

39. The method of claim 38 wherein said third bead overlaps said first bead and extends around the entire circumference of the integrated circuit die.

40. A packaged integrated circuit, comprising:

a substrate;

an integrated circuit die positioned on said substrate, said integrated circuit die having a top surface and sides; and an adhesive surface coating applied to said substrate and said sides of said integrated circuit die for sealing said integrated circuit die to said substrate such that a substantial portion of said top surface of said die is exposed, said adhesive surface coating comprising a first bead of adhesive surface coating applied to said substrate a predetermined distance from said integrated circuit and at least partially around the circumference of said integrated circuit die to form a space therebetween, and a second bead of adhesive surface coating applied in said space to contact said first bead and said integrated circuit die and to extend at least partially around the circumference of said integrated circuit die.

41. The packaged integrated circuit of claim 40 wherein said second bead partially overlaps said top surface of said integrated circuit die.

42. A packaged integrated circuit, comprising:

a substrate;

an integrated circuit die positioned on said substrate, said integrated circuit die having a top surface and sides; and an adhesive surface coating applied to said substrate and said sides of said integrated circuit die for sealing said integrated circuit die to said substrate such that a substantial portion of said top surface of said die is exposed, said adhesive surface coating comprising a first bead of adhesive surface coating applied to said substrate and at least partially around the circumference of said integrated circuit die and a second bead of adhesive surface coating applied to contact said first bead and said integrated circuit die and to extend at least partially around the circumference of said integrated circuit die, said first bead formed of a first type of adhesive surface coating material and said second bead formed of a second type of adhesive surface coating material.

43. The packaged integrated circuit of claim 42 wherein said first type of adhesive surface coating material has a lower flow rate when heated than the heated flow rate of said second type of adhesive surface coating material.

44. The packaged integrated circuit of claim 42 wherein said second bead extends entirely around the circumference of said integrated circuit die.

45. A packaged integrated circuit, comprising:

a printed circuit board having one or more electrically conductive traces formed thereon;

an integrated circuit die affixed to said printed circuit board, said integrated circuit die having a top surface and sides, and a plurality of wires having a first end electrically connected to said integrated circuit die and a second end electrically connected to said traces on said printed circuit board; and an adhesive surface coating applied to said printed circuit board and said integrated circuit die for sealing said integrated die to said printed circuit board such that a substantial portion of the surface area of said top surface of said integrated circuit die is exposed, said adhesive surface coating comprising a first bead of adhesive surface coating applied to said printed circuit board a predetermined distance from said integrated circuit die to form a space between said first bead and said integrated circuit die, and a second bead of adhesive surface coating applied in said space and in contact with said first bead and said sides of said integrated circuit die.

46. The packaged integrated circuit of claim 45 wherein said second bead partially overlaps said top surface of said integrated circuit die.

47. A packaged integrated circuit comprising:

a printed circuit board having one or more electrically conductive traces formed thereon;

an integrated circuit die affixed to said printed circuit board, said integrated circuit die having a top surface and sides, and a plurality of wires having a first end electrically connected to said integrated circuit die and a second end electrically connected to said traces on said printed circuit board; and an adhesive surface coating applied to said printed circuit board and said integrated circuit die for sealing said integrated circuit die to said printed circuit board such that a substantial portion of the surface area of said top surface of said integrated die is exposed, said adhesive surface coating comprising a first bead of adhesive surface coating formed of a first type of adhesive surface coating material and applied to said printed circuit board, and a second bead of adhesive surface coating formed of a second type of adhesive surface coating material and applied in contact with said first bead and said sides of said integrated circuit die.

48. The packaged integrated circuit die of claim 47 wherein said first type of adhesive surface material has a lower flow rate when heated than the heated flow rate of said second type of adhesive surface coating material.

49. The packaged integrated circuit die of claim 47 wherein said second bead extends entirely around the circumference of said integrated circuit die.

\* \* \* \* \*